(12) United States Patent
Martin et al.

(10) Patent No.: US 7,825,679 B2
(45) Date of Patent: Nov. 2, 2010

(54) DIELECTRIC FILM AND LAYER TESTING

(75) Inventors: Andreas Martin, Munich (DE);
Karl-Henrik Rydén, Munich (DE);
Andrea Mitchell, Munich (DE)

(73) Assignee: Infineon Technologies AG, Neubiberg (DE)

( * ) Notice: Subject to any disclaimer, the term of this patent is extended or adjusted under 35 U.S.C. 154(b) by 19 days.

(21) Appl. No.: 12/418,843

(22) Filed: Apr. 6, 2009

(65) Prior Publication Data
US 2010/0253380 A1 Oct. 7, 2010

(51) Int. Cl.
*G01R 31/02* (2006.01)
(52) U.S. Cl. ............... 324/763; 324/765; 324/158.1
(58) Field of Classification Search ............. 324/158.1, 324/525, 719, 527–528, 754–758, 763; 257/48, 257/529, 797, 301–305; 438/14–18
See application file for complete search history.

(56) References Cited

U.S. PATENT DOCUMENTS 6,351,134 B2 * 2/2002 Leas et al. ............... 324/765
6,902,942 B2 * 6/2005 Wu et al. ................. 438/18

OTHER PUBLICATIONS

Martin, A., et al., "Fast and Reliable WLR Monitoring Methodology for Assessing Thick Dielectrics Test Structures Integrated in the Kerf of Product Wafers," 2002 IRW Final Report, 2002, pp. 83-87.

* cited by examiner

*Primary Examiner*—Minh N Tang
*Assistant Examiner*—Trung Q Nguyen
(74) *Attorney, Agent, or Firm*—Slater & Matsil, L.L.P.

(57) ABSTRACT

A system for testing and a method for making a semiconductor device is disclosed. A preferred embodiment includes a conductor overlying a dielectric layer. The conductor is coupled to a first test pad via a first conducting line and to a second test pad via a second conducting line.

21 Claims, 7 Drawing Sheets

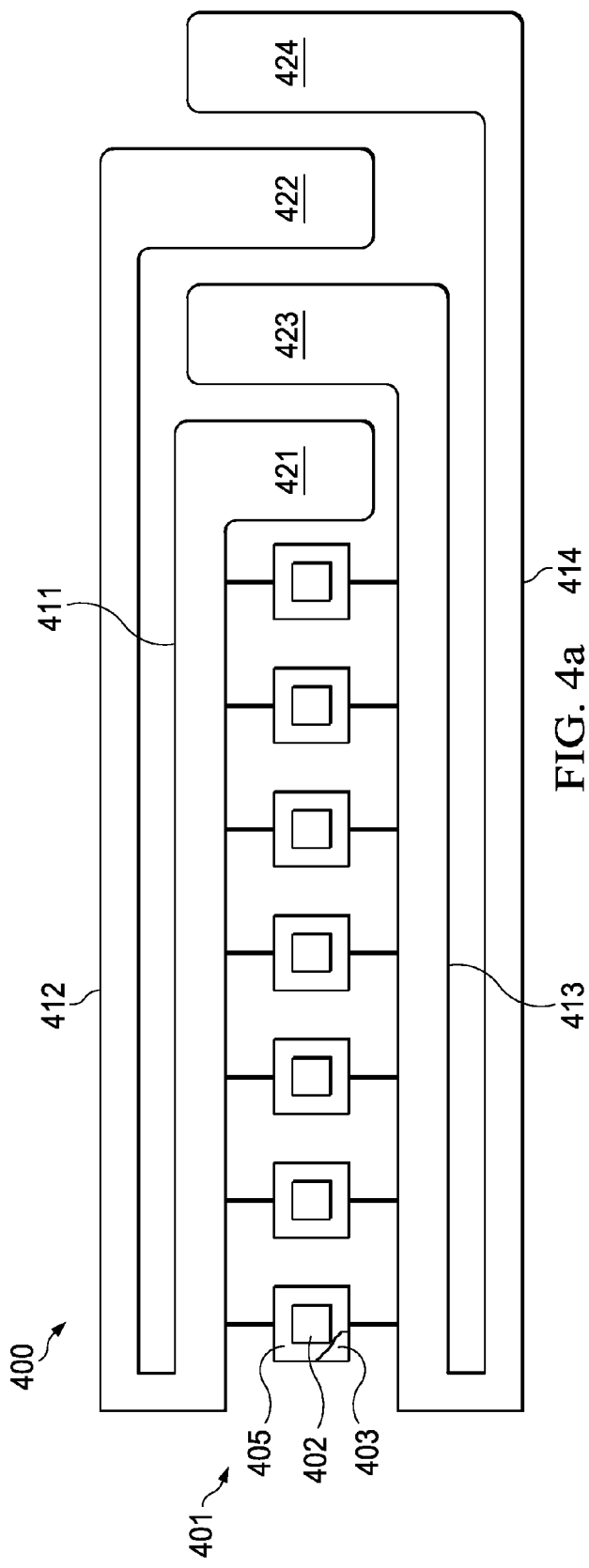
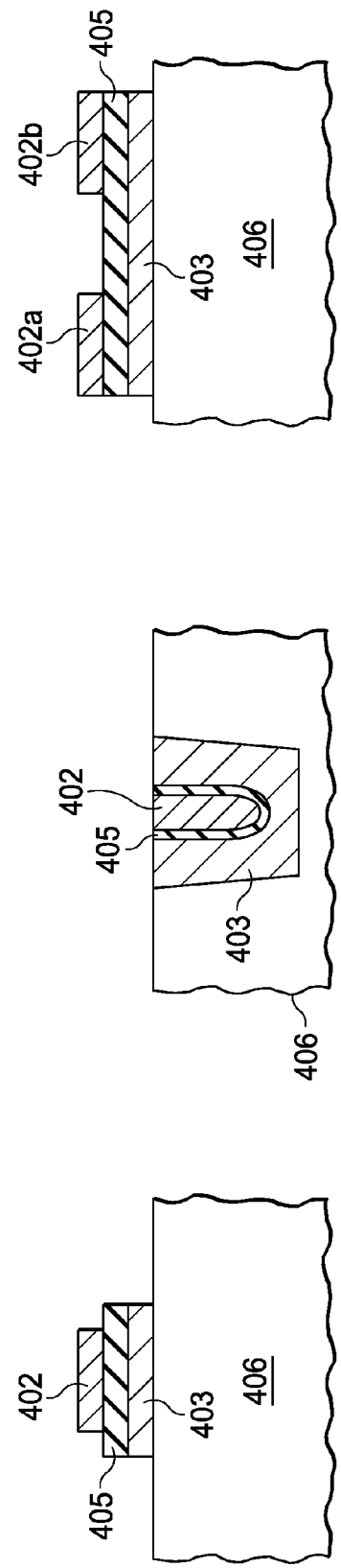
FIG. 4a
FIG. 4b
FIG. 4c
FIG. 4d

DIELECTRIC FILM AND LAYER TESTING

TECHNICAL FIELD

The invention is related to semiconductor structures and methods and, in particular embodiments, to the characterization of a film, layer or stacked layers forming a dielectric disposed on a semiconductor wafer, whereby the layers are not necessarily planar and not necessarily in contact with the semiconductor substrate.

BACKGROUND

In semiconductor manufacturing various dielectric films and layers are used to manufacture semiconductor devices such as MOS and memory devices or other integrated circuit devices. Scaling, the process of decreasing the size of semiconductor devices, requires more reliable semiconductor devices. As the size of the semiconductor devices decreases, the number of devices in an IC increases. Therefore, the reliability of each device should increase, or in other words, the failure probability per device should decrease. Along with higher demand for reliability more elaborate testing procedures are also required. The more elaborate testing procedures may lead to more precise and accurate device reliability data.

Dielectric film or layer testing is necessary to discover contaminations, inhomogenities or defects of the film leading to poor performance, poor reliability and short life expectancy of the respective semiconductor devices. Accurate measurement of the quality of the dielectric film or layer is required. Various errors can be made. One source of error can be the set up of the test arrangement. Inaccurate test arrangement results in misleading reliability measurement data which in turn lead to incorrect wafer testing results.

One way of testing dielectric films or layers is to perform the test on product wafers (in line test). In case of a destructive or lifetime reducing test, the tested semiconductor devices can be specifically designed and integrated in the kerf, or scribe line, or chip region so that the test does not affect the adjacent chip areas that become dies later in the process. After the test is performed, the semiconductor devices, arranged and located in the kerf or chip region, are at least partially destroyed.

SUMMARY OF THE INVENTION

In accordance with an embodiment of the present invention, a test structure includes a dielectric layer and a conductor overlying the dielectric layer. A first test pad has a first conducting line that couples the first test pad to the conductor. A second test pad has a second conducting line coupling the second test pad to the conductor.

Another embodiment relates to a method of testing a dielectric layer. A semiconductor device includes a dielectric layer and an overlying conductor. A first test of the dielectric is performed by applying a first test voltage or current to the conductor and a second test of the dielectric is performed by applying a second test voltage or current to the conductor through a resistor.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3b and 3c provide cross sectional views of the testing arrangement of FIG. 3a;

FIG. 4a shows a schematic view of another embodiment of the present invention, wherein a testing arrangement for capacitors is provided;

FIGS. 4b, 4c, and 4d provide cross sectional views of capacitors;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a system and method to test a dielectric film or layer. The system and method measures and tests all types of dielectric structures in semiconductor devices such as all types of MOS transistors, lateral and vertical transistors, MIM (Metal Insulator Metal) capacitors; MIS (Metal Insulator Silicon) capacitors; poly silicon to poly silicon capacitors and inter/intra metal capacitors, as just some examples. The capacitances may be arranged in lateral or vertical configurations or any combination thereof. The dielectric structures are preferably formed and arranged in the kerf or scribe line. The arrangement of the structures in the kerf or scribe line has the advantage that in-line testing on product wafers is possible which eventually saves time and area and reduces or eliminates yield loss.

Figure 1:
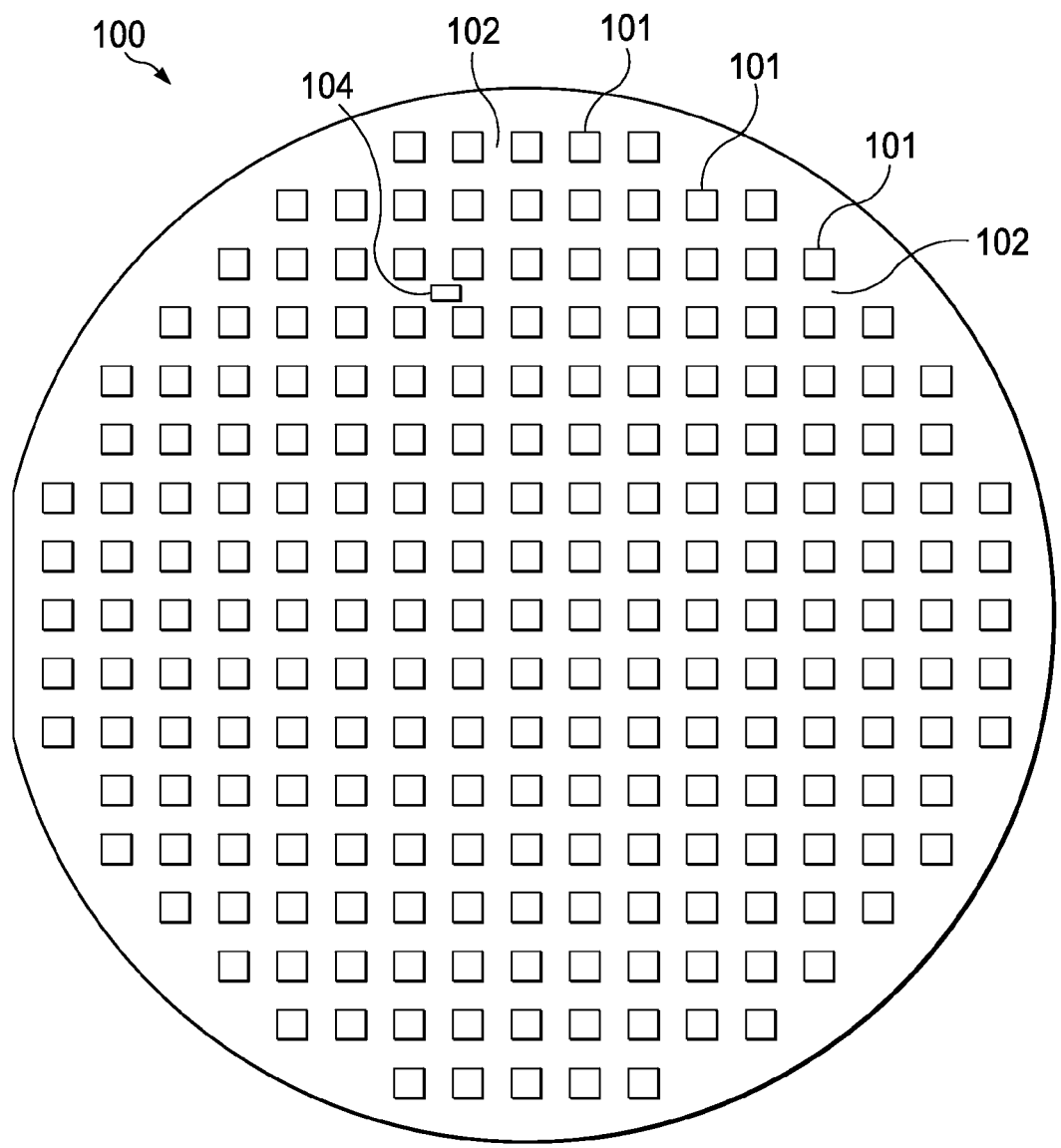
FIG. 1 shows a schematic view of a wafer.

FIG. 1 shows a top view of a wafer 100 that can utilize embodiments of the present invention. The wafer is subdivided into a plurality of die regions (e.g., integrated circuits, chips, semiconductor arrangements, and/or other products) 101 separated by a plurality of kerf regions 102. The die regions 101 include a plurality of circuit elements. As will be discussed below, a number of test structures 104 (e.g., structure 300 of FIG. 3a or structure 400 of FIG. 4a) can be formed in the kerf regions 102. While only one test structure 104 is illustrated, it is understood that a number of such structures can be placed throughout the wafer.

Each die region 101 includes a number of circuit structures that can be included to perform the desired functionality of the chip (e.g., logic circuits for a logic chip or memory circuits for a memory chip). As will be discussed in more detail below, the test structures 104 can be used to provide information about the circuit structures. As an example, the test structure 300 of FIGS. 3a-3c (FIGS. 3b and 3c show structure 301) can be used to evaluate the gate dielectric of transistors on the wafer or the test structure 400 of FIG. 4a can used to evaluate the capacitor dielectric of capacitors on the wafer. As will be clear to one of skill in the art, other test structures can be used for other purposes.

In other embodiments, the test structures that will be described in more detail below can be formed on a separate test wafer. This embodiment is useful for the case where new processes or equipment need to be evaluated. In yet other embodiments, the test structures can be formed in die areas of the wafer, i.e., in place of some of the die regions 101.

Figure 2A:
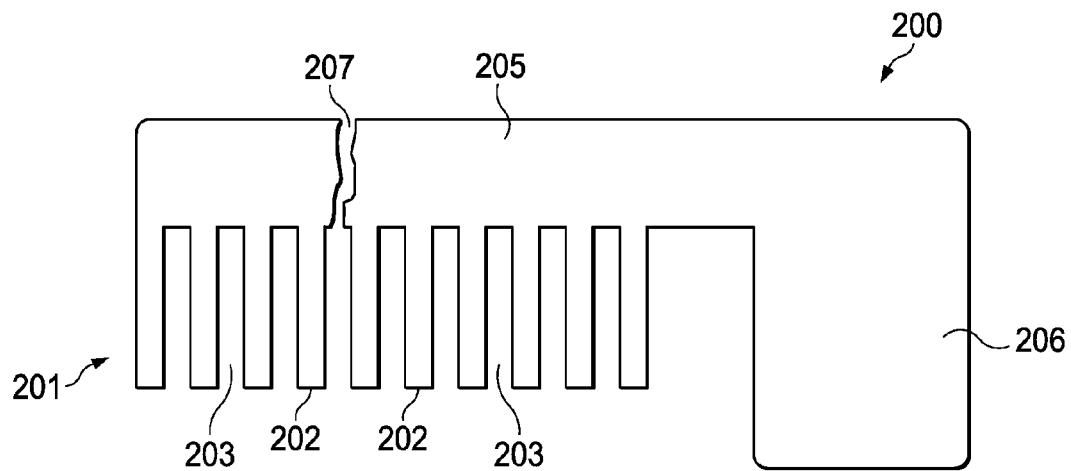
FIG. 2a shows a schematic view of a conventional MOS device array including a probe pad for the gate electrode.

A known test structure 200 for a transistor array in a kerf 102 is shown in FIG. 2a. The plan view shows a number of transistors 201, each transistor including a gate 202 and two adjacent source/drain regions 203. The dielectric material film or layer (not shown) is arranged beneath the gates 202. The plurality of gates 202 is coupled via a conducting line 205 to a probe pad 206. The semiconductor substrate, well and the source and drain regions are independently connected via conducting lines to other pads (not shown).

Figure 2B:
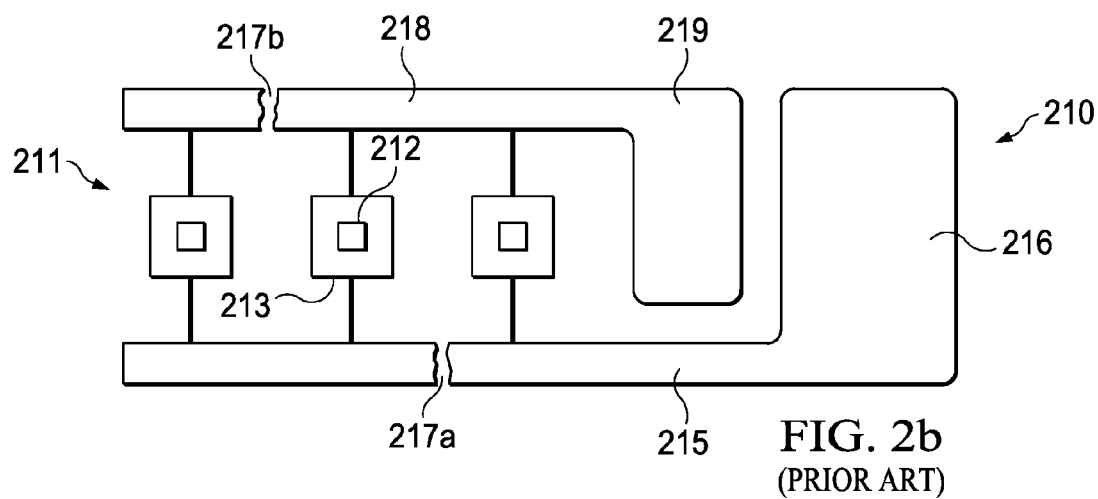
FIG. 2b shows a schematic view of a conventional capacitor array including two probe pads for the capacitor electrodes.

Turning now to FIG. 2b, a known testing arrangement 210 for a capacitor array, such as MISs or MIMs, is illustrated. The plan view shows a plurality of capacitors 211, each capacitor including an upper electrode 212 and a lower electrode 213. The dielectric material film or layer, which is not explicitly shown, is arranged between the upper electrode 212 and the lower electrode 213. Each of the upper electrodes 212 is coupled via a conducting line 215 to a probe pad 216 while each of the lower electrodes 213 is coupled via a conducting line 218 to a probe pad 219.

The testing arrangement 200 or 210 can be used to evaluate the dielectric between the gates 202 and the counter electrodes (e.g., substrate/well, drain, source regions other gates) or between the electrodes 212 and 213. Since the arrangement 200 (210) has been fabricated on the same wafer as the transistors used in the circuitries of the dies to be sold, it can be assumed that the information learned from the test structures can be used to evaluate the reliability of the die circuitries. For example, if the dielectric breaks down prematurely it might be assumed that the die circuitries would have reliability issues and, therefore, these wafers might be removed from production.

Since evaluation of commercial product is based upon the testing arrangement, it is clearly problematic if these tests are not accurate. For example, to evaluate the breakdown voltage, a voltage between probe pad 206 and the underlying semiconductor region (or between probe pad 216 and probe pad 219) is increased to thereby increase a voltage drop between the gates 202 and the underlying substrate, with the dielectric film or layer in between. When a breakdown of the dielectric film or layer occurs at a certain voltage, the current flow will increase substantially since the insulator is no longer effective. The high current transient could cause the interconnect 205 (FIG. 2a) or 215, 218 (FIG. 2b) to melt as shown by region 207 (FIG. 2a) or 217a and 217b (FIG. 2b).

In the case shown in FIG. 2a, the conducting line 205 is fused so that portions of the transistor array 201 at the opposite end of the probe pad 206 are disconnected from the probe pad. This same issue can occur for the conducting lines 215 and 218 where parts of the capacitor array may be fused at the opposite end of the probe pads 216 and 219 as shown in FIG. 2b. As a result, the effective structure area decreases. Such an event can happen multiple times and, if not detected, would result in erroneous experimental data. The event of fusing off part of the structure cannot be detected by "slow" measurement equipment, e.g., a standard SMU (source and measurement unit) of parametric testing, and cannot be verified electrically after the event.

While the conventional breakdown stress test has been described with regards to a voltage ramp, it can also be performed with a current ramp, a constant voltage or current stress, pulsed stress or any combinations thereof.

In some instances, e.g., at a dielectric breakdown, the current flow increases so fast and substantially that the area where the dielectric film or layer break down occurred explodes creating a rupture and scattering parts and particles over the kerf 102 and adjacent areas such as the circuit elements in die regions 101. Accordingly, it is desirable to avoid such rupturing, even if it could be detected and compensated since the contamination of the adjacent semiconductor arrangements may lead to yield loss.

The conventional testing arrangement has not been successful in accurately measuring the breakdown voltages, when part of the structure disconnects/fuses off. However, a precise measurement of the voltage provides information about the dielectric film or layer quality. Hence, the conventional testing arrangement can result in the extraction of erroneous test data.

Furthermore, in case of an abrupt dielectric layer or film breakdown at high voltages, a probe card may be damaged. The probe card, an interface between the test equipment and the semiconductor structure to be tested, typically has a plurality of probe pins or probe needles arranged in a certain style. Through the probe card and the probe pins, the test equipment is electrically connected to the probe pads of the semiconductor structure. Under the conventional test arrangement, the probe card may be damaged because the current flow increases substantially and in some cases even overshoots, e.g., increases from nanoamperes to amperes, when a breakdown occurs.

Thus, a dielectric layer or film stress test arrangement is desired where the voltage at a breakdown event may be accurately measured and where explosions or ruptures of break down areas may be avoided.

Figure 3A:
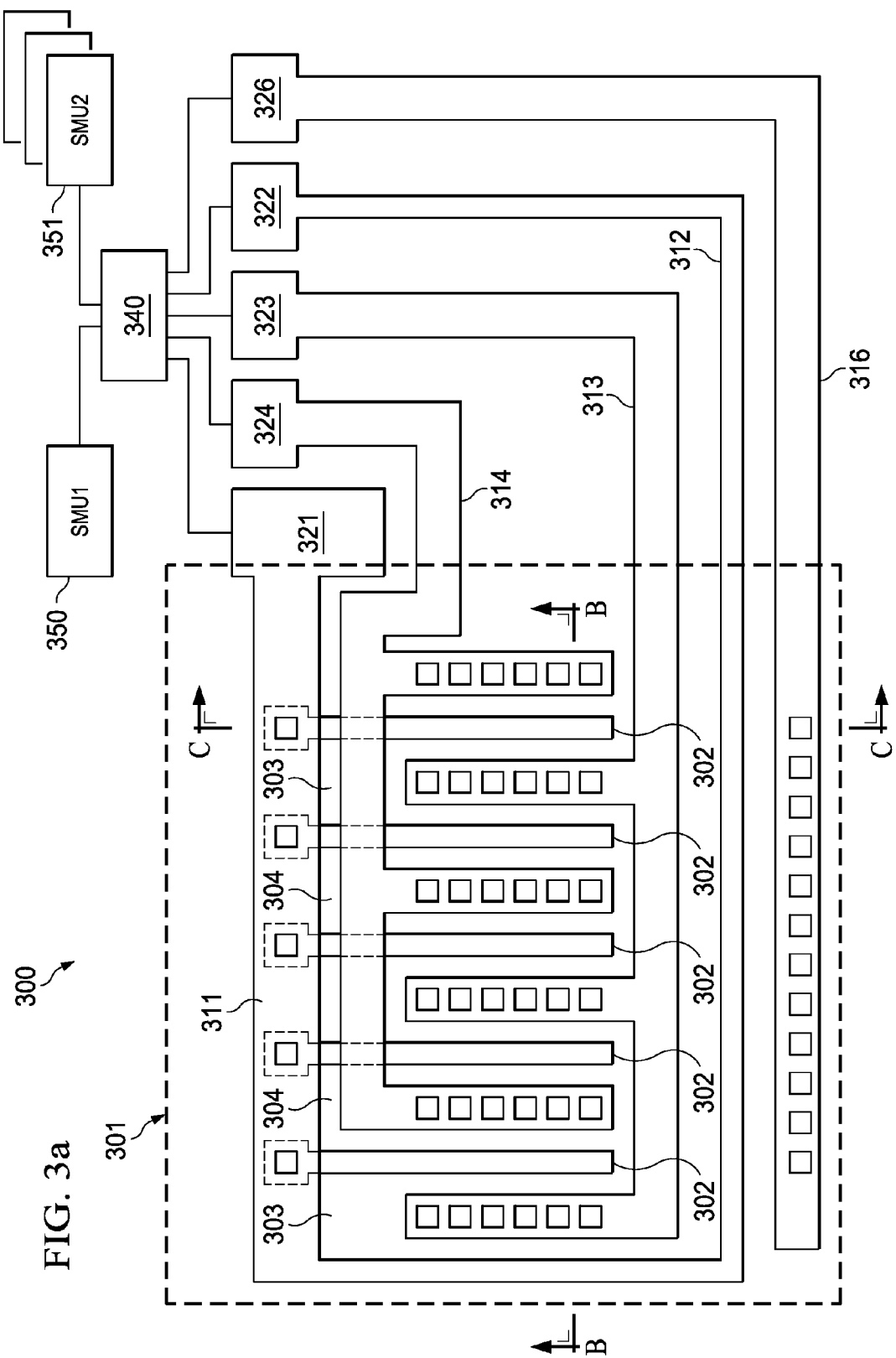
FIG. 3a shows a schematic view of an embodiment of the present invention wherein a testing arrangement for testing MOS devices is provided.
Figure 3B:
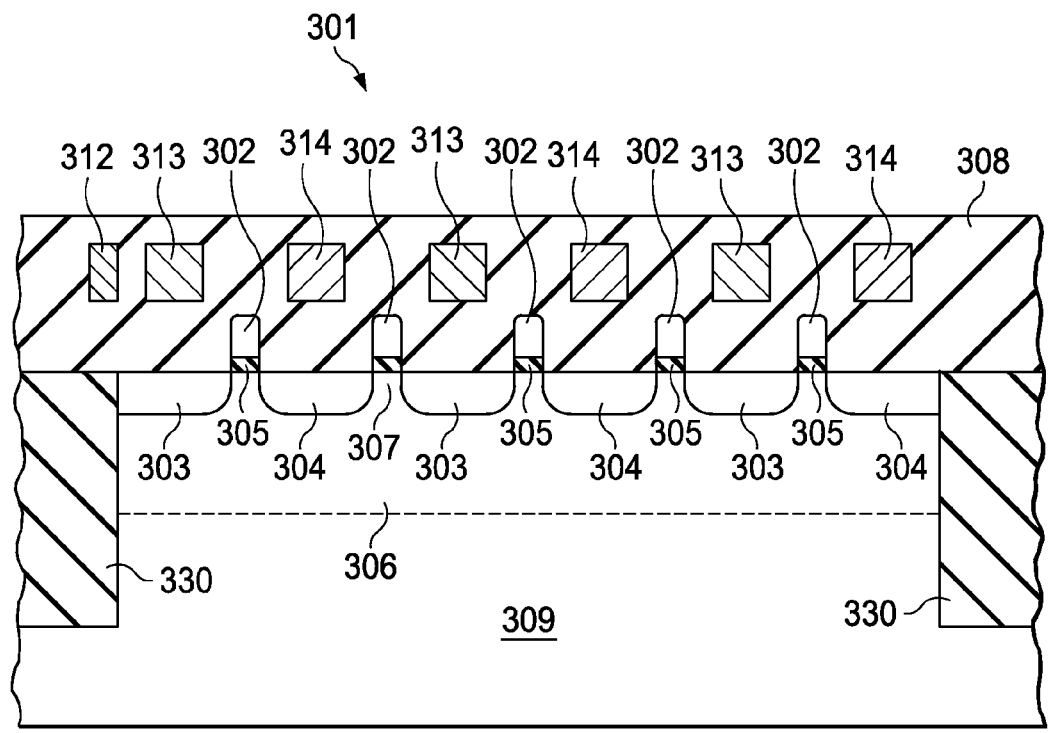
Figure 3C:
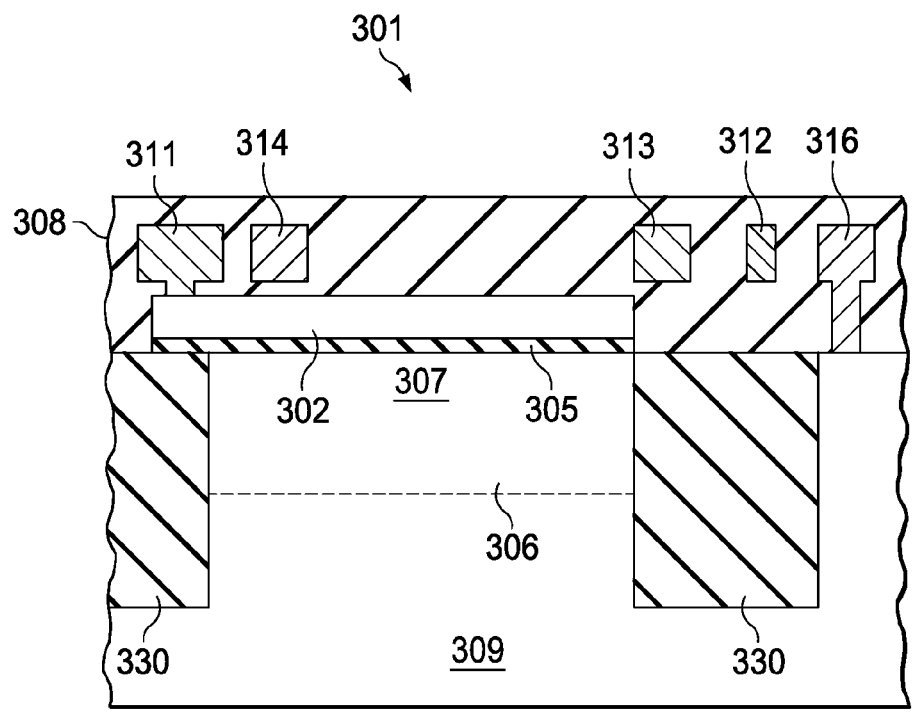

A first embodiment of the present invention is illustrated in FIGS. 3a-3c. FIG. 3a is a plan view of a novel testing arrangement 300 for a transistor array. As shown in FIG. 1, the test structure 300 (labeled as 104 in FIG. 1) can be arranged in the kerf 102 of a wafer or as otherwise described herein. The transistor array 301 includes a plurality of gates 302 that are electrically connected to a first probe pad 321 via a first conducting line 311. Advantageously, the gates 302 are also electrically connected to a second probe pad 322 via a second conducting line 312. The via contacts between the conducting line 311 and the underlying polysilicon gates 302 are shown by square boxes.

The second probe pad 322 is preferably connected in such a way, that it contacts the transistor array at the opposite end of the array. For example, FIG. 3a shows a connection from the array to pad 322 via line 312. Additionally more probe pads with conducting lines can be connected to the gates 302 of the transistor array. Two possible reasons to do this include 1) distribution of injected current across more than one pad and conducting line and 2) conducting lines with different resistances can be integrated to choose the most suitable resistance for the stress test.

The transistor test structure 300 also includes source regions 303, which are connected to a third probe pad 323 via a third conducting line 313, and drain regions 304, which are connected to a fourth probe pad 324 via a fourth conducting line 314. Once again, via contacts between the metal of lines 313 and 314 and the underlying silicon are shown by square boxes. While only five transistors are shown, it is understood that considerably more are included in a typical test structure. It is noted that these connections, while not illustrated, are included in structure 201 of FIG. 2*a*.

The configuration of FIG. 3*a* provides merely one example of how the test structure could be connected. For example, the locations of the various metal lines could be altered. While a single level of metal is shown, it is understood that multiple levels of metal could be alternatively be used.

Well region 306, which is illustrated in the cross-sectional views of FIGS. 3*b* and 3*c*, is electrically connected to a fifth probe pad 326 via a fifth conducting line 316. The well region 306 is a doped region in a semiconductor substrate. In other embodiments, an SOI or other substrate could be used. The active area is provided within well region 306 between insulating regions (e.g., shallow trench isolations) 330. The well region 306 can be doped to an n-type region or p-type region, depending upon whether a p-channel or an n-channel transistor is being formed. It is once again noted that these connections, while not illustrated, are included in structure 201 of FIG. 2*a*.

The substrate may be connected to an extra pad, together with the well, instead of the well if no well is available or in a different way (e.g., together with source).

Under test conditions, the probe pads 321, 322, 323, 324 and 326 are each electrically connected to the test equipment 350 and 351 via the probe card 340 and the probe needles or pins (not shown). In FIG. 3*a*, the test equipment 350, 351 are each illustrated diagrammatically as "source and measurement units" (SMUs), but it is understood that any test set or other equipment could be used.

In the illustrated embodiment, two probe pads 321 and 322 are used for the gates 302 and one probe pad is used for each of the other connections. It is understood, however, that additional probe pads can be used for any of these connections as well as combinations of this connections. For example, additional probe pads with various resistances in the connection and combinations thereof can be used to tailor the resistance applied during the testing.

FIG. 3*b* shows a cross section of the transistor array 301 along the horizontal line BB in FIG. 3*a*. A dielectric film or layer 305 is formed over the semiconductor region 306 and a gate 302 is formed over the dielectric film or layer 305. The source regions 303 and the drain regions 304 are arranged in the well region 306 and are separated from each other by channel regions 307. As with other transistors, p/n or n/p junctions are formed adjacent the gate dielectric.

The semiconductor body 309 may comprise a semiconductor substrate that may include silicon, compound semiconductors such as GaAs, SiGe, InP or any other suitable semiconductor materials. The substrate may be a silicon on insulator (SOI) substrate. In this case, a semiconductor layer 306, which is typically but not necessarily silicon, is disposed over an insulator (not shown), which may then be disposed over a substrate. Concepts of the invention can also be applied to other structures, such as printed circuit boards that do not include a semiconductor body.

The plurality of gates 302 may comprise a conductive material such as a semiconductor material or a metal. For example, the plurality of gates 302 may comprise polysilicon, e.g., silicided polysilicon, or alternatively, other materials such as TiN, HfN, TaN.

The source/drain regions 303, 304 are doped regions within the semiconductor body 306. The dopant species typically comprises an element from Group III or Group V of the periodic table. For example, boron is the typical dopant of silicon for p-channel transistors and arsenic or phosphorus are typical dopants of silicon for n-channel transistors. Alternatively, other materials can be used.

The dielectric film or layer 305 may be silicon oxide, e.g., $SiO_2$ or SiON. Alternatively, a high-k material with a dielectric constant greater than 7 can be used. Examples of such materials include $HfO_2$, $Al_2O_3$, $ZrO_2$, $Si_3N_4$, similar materials or combinations thereof. The dielectric film or layer 305 may be up to about 2000 nm thick but preferably about 1 to 100 nm, depending on the technology node.

FIG. 3*c* shows a cross section along a vertical line CC in FIG. 3*a*. The semiconductor region 306 is separated in different regions by insulating regions 330, which are preferably shallow trench isolations (STI). The first conducting line 311 is disposed over the plurality of gates 302 and electrically coupled thereto, e.g., by conductive vias disposed in dielectric layer(s) 308, which is disposed above the plurality of gates 302, the isolation regions 330 and the semiconductor body 306. This layer 308 may be an oxide such as TEOS or doped glass such as BPSG. The second conducting lines 312, 313 and 316 are disposed over the semiconductor region 306 in the dielectric layer(s) 308. The first and second conducting lines 311, 312, 313 and 316 can be of any conductive material, for example Al, Cu, their alloys or polysilicon.

As noted in the figure, the conductor 311 is preferably wider than the conductor 312 and, as a result, will have a lower resistance. The first conducting line 311 has a width preferably between 10× to 50× minimum feature size. The second conducting line 312 has a width preferably between 1× to 10× minimum feature size. In one embodiment, the second conducting line 312 is between about 2 and 10 times narrower than the first conducting line 311. The second conducting line 312 preferably has a higher resistance than the first conducting line 311.

As will be discussed in more detail below, the second conducting line 312 may provide a higher resistance in the current path between the test equipment 350, 351 and the test structure 300. The resistance of the second conducting line 312 may vary and may depend on what structure is to be tested. The chosen resistance may depend on the set up of the test, for example, the higher the voltage to be applied, the higher the resistance to be selected. The resistance of the second conducting line 312 may be increased by additional resistances in the line or at the end of the line, e.g., between the probe card 340 and the test pad 322 or between the test equipment 350, 351 and the probe card 340. For example, the additional resistance can be added within either the test equipment 350, 351 and/or the probe card 340. Moreover, the resistances may, alternatively, be placed in the first conducting line 311.

Turning now to FIGS. 4*a*-4*d*, a second embodiment of the present invention is illustrated. FIG. 4*a* is a plan view of a novel testing arrangement 400 for a capacitor array 401, which may be arranged in the kerf 102. The capacitor array 401 comprises a plurality of upper electrodes 402, a plurality lower electrodes 403 and a dielectric separating the upper electrodes 402 from the lower electrodes 403. The capacitor array 401 can be of the type described with respect to FIG. 2*b*. In one example, the electrodes 402, 403 can be of conducting or semiconducting material. The electrodes can be configured to form a lateral capacitor, e.g., MIM, MIS, poly-poly, intermetal dielectric, or a vertical capacitor, e.g., trench capacitor, intrametal dielectric, $V_{pp}$ capacitor (inter- and intrametal capacitor). The dielectrics can be low-k (e.g., Coral, SiLK, Black Diamond, etc.), high-k, or even a long-used dielectric such as $SiO_2$, The plurality of upper electrodes 402 are connected via a first conducting line 411 to a first probe pad 421 and via a second conducting line 412 to a second probe pad 422. The plurality of lower electrodes 403 are connected via a third conducting line 413 to a third probe pad 423 and via a fourth conducting line 414 to a fourth probe pad 424. The arrangement that is used for the gate connection in FIG. 3a is now used for each electrode of the capacitor in FIG. 4a. Each electrode has a second conducting line that has a higher resistance than the first conducting line.

The second probe pad 422 and the fourth probe pad 424 are preferably connected in such a way, that they contact the capacitor array at the opposite end of the array. For example, FIG. 4a shows a connection from the array to pad 422 via line 412 and to pad 424 via line 414. Additionally more probe pads with conducting lines can be connected to the electrodes of the capacitor array. Two possible reasons to do this include 1) distribution of injected current across more than one pad and conducting line and 2) conducting lines with different resistances can be integrated to choose the most suitable resistance for the stress test.

FIGS. 4b-d show different types of capacitors. FIG. 4b illustrates a planar capacitor. A lower electrode 403 is disposed over a substrate 406 of any material and an upper electrode 402 is arranged over a dielectric 405 which in turn is disposed over the lower electrode 403. FIG. 4c illustrates a deep trench capacitor. A trench is formed in a substrate 406 and a lower electrode 403 is formed in the substrate 406. A dielectric 405 is disposed over the lower electrode 403 and an upper electrode 402 is disposed over the dielectric 405 and is at least partially filling the trench. FIG. 4d shows a variation of the planar capacitor illustrated in FIG. 4b. This capacitor features two upper electrodes 402a and 402b. This capacitor can be used as a stacked capacitor where the two upper electrodes are connected to different electrical potentials without connecting the lower electrode. Alternatively, the capacitors may also be three-dimensional devices. To avoid repetition, the capacitor include types, materials and thicknesses as described above.

The inventive arrangement of probe pads and interconnecting lines for testing a dielectric film and layer has been described with reference to a specific test structure. Other test structures could alternatively be used. For example, while the test structures of FIGS. 3a-c include a specific transistor array, the same pad and interconnect arrangement could be applied to any other kind of transistor arrays or single device. FIGS. 4a-d describe a specific capacitor array and the special pad and interconnect arrangement can be applied to any kind of capacity array or single device.

Since the test structures 300 and 400 are typically provided in the kerf region 102, it is advantageous if the structure is long and narrow since it is advantageous to minimize the width of the kerf region. In one example, the test structure has a width (e.g., along the width of the transistor channels of test structure 300) of about 100 μm or less and a length (e.g., along the conductor 311 of test structure 300) of about 2500 μm to about 6000 μm. In one embodiment, the ratio of the length to the width is at least 30:1, preferably at least 50:1.

The test structure preferably is used for wafer level measurements, but can be also used for testing in a package.

Figure 5A:
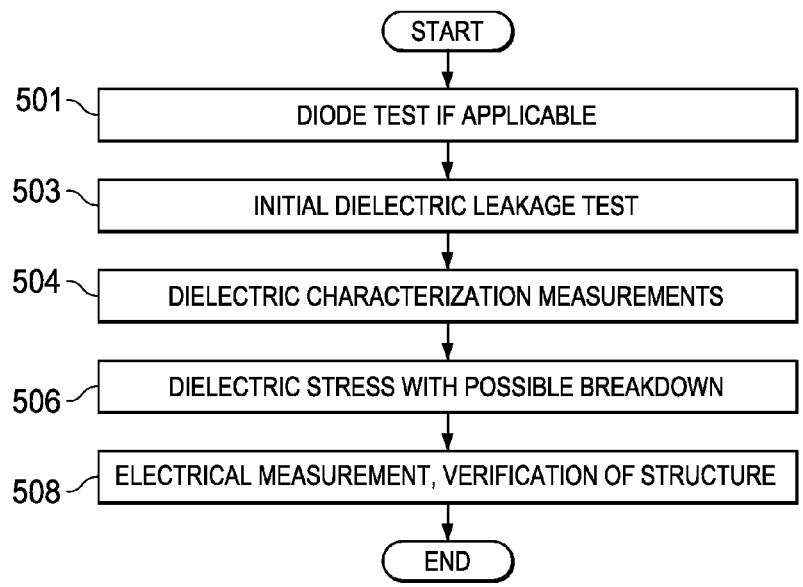
FIG. 5a shows a flowchart for a conventional testing arrangement.
Figure 5B:
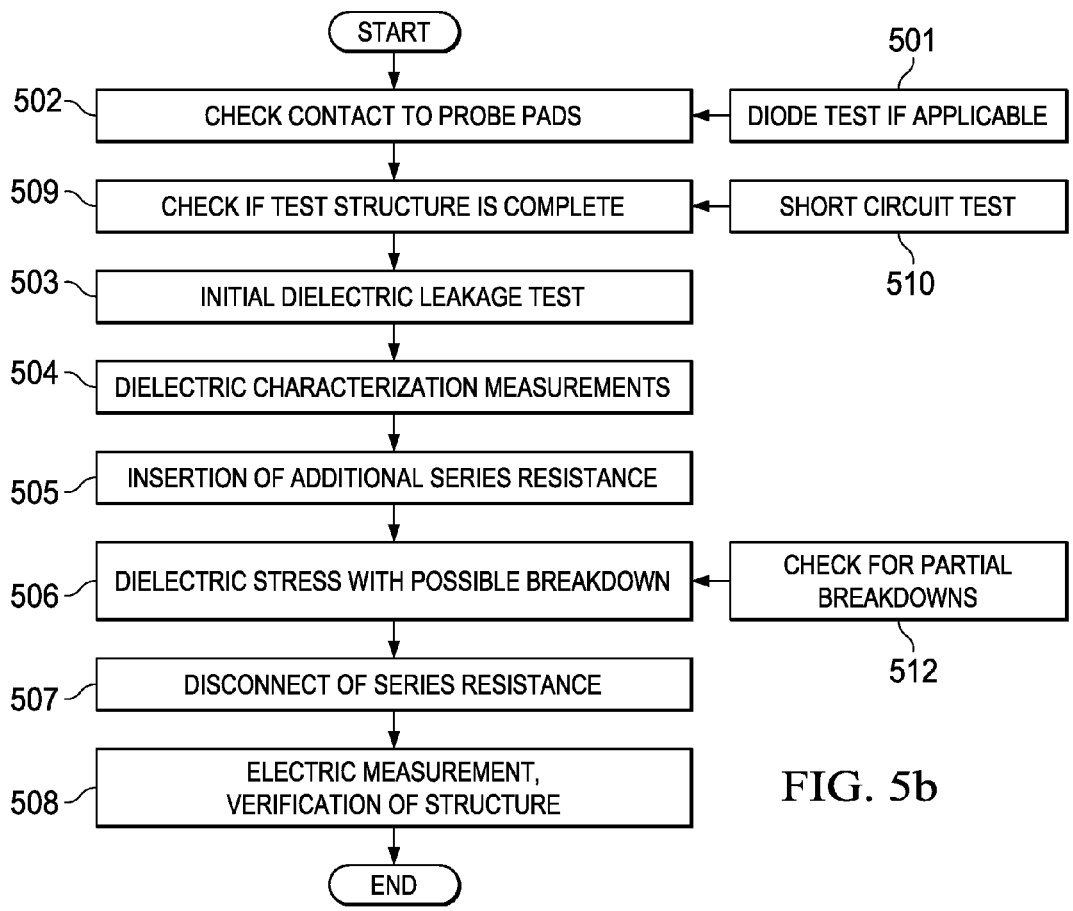
FIG. 5b shows a flowchart for a testing arrangement of an embodiment of the invention.

A test method of an embodiment of the present invention will now be described with respect to FIGS. 5a and 5b, where FIG. 5a shows a conventional method and FIG. 5b shows an embodiment of the present invention. The novel method may be practiced with the structure described with respect to FIGS. 3a-3c, 4a-4d or other test structures. The method may be exercised manually or automatically and may be implemented into a stress test algorithm or software. The method is described according to a testing arrangement for a transistor array but may be carried out similarly for a testing arrangement of a capacitor array.

Referring now to FIG. 5a, a conventional method will be described with respect to a conventional test structure, as shown in FIG. 2a. This method for testing starts with an initial contact verification by using a diode test at 501. In this step, an electrical voltage is applied to the drain or source region and a current is measured across the drain to well/substrate junction or the source to well/substrate junction. For example, a forward current of a pn-diode can be measured. In this manner, the contacts of source/drain 203 and well or substrate of the structure, are verified.

At 503, an initial dielectric leakage test is performed. In this step, an electrical voltage is applied to the gates 202 and a current is measured against drain, source 203 and well/substrate region (not shown). If a high current (technology and device depending) is measured the test structure has an initial fail.

At 504, dielectric characteristic measurements are taken, such as gate to drain leakage, gate to source leakage, threshold voltage, channel current and dielectric capacitance measurements.

At 506, a dielectric stress test is performed. Any type of stress measurement of the dielectric can be applied such as constant voltage stress, ramped voltage stress, constant current stress or ramped current stress or any combination of these stresses. This test is usually performed until the dielectric breaks down. Alternatively, the test can be terminated before the breakdown occurs to avoid current transients.

Finally, at 508, an electrical measurement and verification of the structure is performed as described with respect to 501, 503 and 504.

A novel test method will now be described with respect to the flow chart of FIG. 5b. This test is preferably performed using a test structure with two test pads per gate or electrode, as illustrated in FIG. 3a or 4a. The test method will be described according to the arrangement for the gate of FIG. 3a but is equally applicable for the arrangement of the electrodes of FIG. 4a as well as other test structures. As will be discussed, however, the new steps 505, 507 in the test methods can also be performed with a conventional test structure such as the one illustrated in FIG. 2a or 2b.

As with the conventional method, a drain, source and well/substrate contact verification test can be performed as in 501. The new test arrangement of FIGS. 3a and 4a can be used to check the probe pad contacts 321, 322 of the plurality of gates 302 or electrodes 402 and 403 as illustrated by box 502. In this case a leakage or resistance measurement is performed between the two probe pads 321, 322, for the plurality of gates 302 or electrodes 402 and 403.

In 509 and 510, the test structure can be tested for completeness and verification of good probe contact resistance (short circuit test). The completeness of the structure can be tested via short cut testing. Accordingly, a connection between the first contact pad 321 and the second contact pad 322 can be tested. This test will determine if either contact line 311 or 312 includes a break (i.e., an open portion). Alternatively, an excessive resistance between the two pads can be determined. By performing this test, the scenario where tests are unknowingly performed on only a portion of the structure can be avoided.

The initial dielectric leakage test 503 and dielectric characterization measurements 504 can then be performed as discussed above with respect to FIG. 5a. These tests are preferably performed using the first test pad 321, with a lower resistance between the test equipment 350, 351 and the test structure 300. Alternatively, both probe pads 321 322 may be jointly biased.

Dielectric characterization measurements 504 can comprise capacitance voltage characteristics employing two probe pads per electrode (421, 422 and 424, 424 of FIG. 4a) for the elimination of detrimental high series resistance in the measurement set up.

Figure 6A:
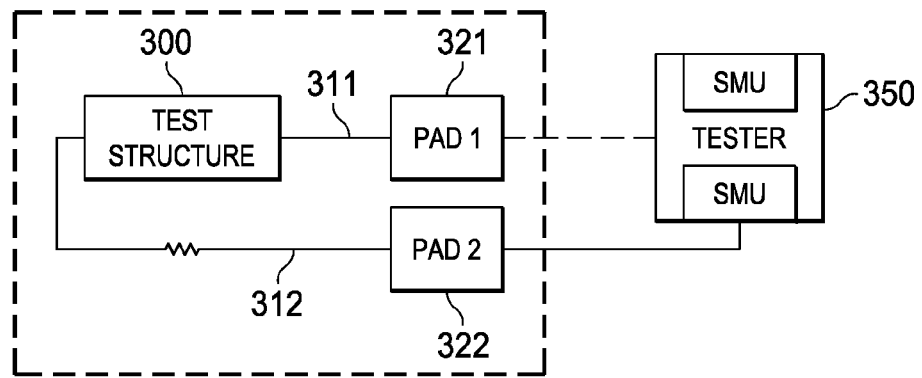
FIG. 6a shows a schematic view of a testing arrangement.

The next step illustrated in the flow chart is step 505, labeled as insertion of additional series resistance. The insertion can be performed in a number of ways as will be described with respect to FIGS. 6a-6c.

In various embodiments, a serial resistance may be placed in different locations of the test arrangement 300, 400. For example, the resistances can be placed in interconnects, in the test structure itself and/or in the probe needle contact to the pad. When the test structure is biased, a significant voltage drop occurs at the serial resistances at high currents. As a result the voltage monitored does not represent the voltage drop across the dielectric layer and therefore the breakdown voltage is not the real breakdown strength of the dielectric layer. Consequently the reliability/quality of the product could be overestimated if no corrections are applied. In this case the additional pad per electrode can be used to eliminate the voltage error in the measurement by using one pad as force and the other as a sense. Force connections will be connected via probe cards to a SMU of the tester each. Sense connections will be connected via probecards to a SMU of the tester each or to a DVM (digital volt meter).

Using the test structure of FIG. 3a, the electrical connection between the test equipment 350, 351 and the test structure 300 is switched from test pad 321 to test pad 322. Now the potential will be applied through the more resistive interconnect line 312, e.g., due to the width, thickness and/or material of the interconnect. This configuration is illustrated schematically in FIG. 6a. The previous connection between the test equipment 350, 351 and probe pad 321, which was used during the tests 503 and 504, is illustrated by a dashed line. The serial resistance between 321 and 322 can be measured individually for each test structure. The interconnect 311 may be used as sense line now.

In an alternative embodiment, which is not illustrated, the additional resistance can be added between the electrode, e.g., the source/drain electrodes connected to pads 323 and/or 324, and the pad 321. In this case, the source/drain regions could be electrically connected to two pads (only one of which is shown in FIG. 3a). The additional resistance in the line would serve the same purpose as described herein.

Figure 6B:
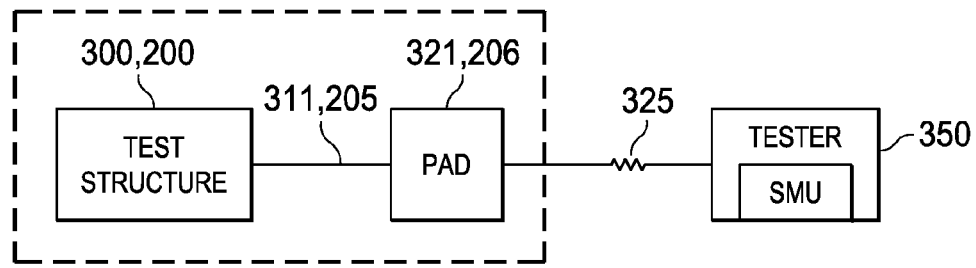
FIGS. 6b and 6c provide a schematic view of alternative testing arrangements.

In an alternate embodiment, an external resistance 325 can be added in the circuit between the test equipment 350, 351 and the test pad 321 (or 206), as shown schematically in FIG. 6b. As shown by the numbering of the figure, this embodiment can use either the conventional test structure 200 of FIG. 2a or the test structure 300 of FIG. 3a. The resistance 325 can be added at the test equipment 350, 351, at the probe card 340 or anywhere else between the test circuitry and the test structure 300. One disadvantage of the structure in FIG. 6b is that the short circuit test 510 cannot be performed since there is only one pad 321.

Figure 6C:
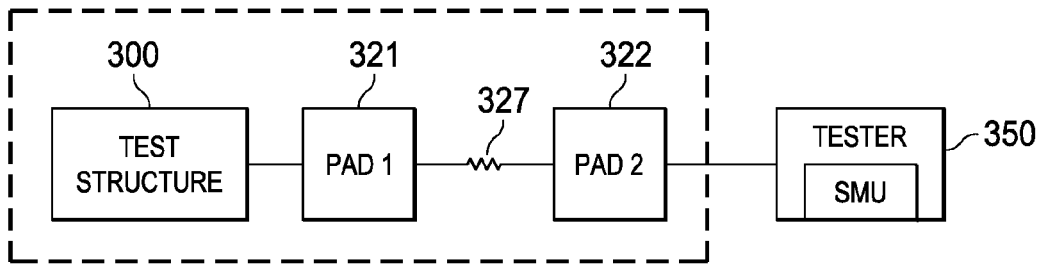

A third embodiment is shown in FIG. 6c. In this case, the two test pads 321 and 322 are provided in series between the test equipment 350, 351 and the test structure 300. A resistance 327 is provided between the test pad 321 and the test pad 322. This resistance 327 can be formed by any technique known for the wafer technology. As a result, a more specific resistance can be obtained. In this case, the initial leakage test 503 and dielectric characterization measurements 504 can be performed by probing test pad 321 while the dielectric stress test can be performed using test pad 322. One disadvantage of the structures in FIGS. 6b and 6c is that the test structure completeness test 509 cannot be performed since the test structure is no longer between the test pads 321 and 322.

With the additional resistance 312 (325 or 327), the dielectric stress test can be performed as described above. In this case, however, the test can be continued until the dielectric 305 breaks down. In view of the additional resistance, the current through the structure is limited by the additional resistance so that even if the dielectric provides no additional resistance, the maximum current $I_{test}$ that can flow will be $I_{test} = V_{test}/R_{insert}$, wherein $V_{test}$ is the voltage between the test structure gate 302 and source/drains 303/304 and well/substrate or for a capacitance between the electrodes (FIG. 4b) and $R_{insert}$ is the resistance between the test equipment 350, 351 and the test structure 300. Accordingly, the maximum current can be limited to a level that will not cause damage to structures adjacent the test structure.

For more precise measurements, both pads 321 and 322 can be connected to the test equipment 350, 351, i.e., a SMU each or a SMU and a DVM. Applying a power via the SMU to probe pad 322 (high resistive path) the voltage drop across the dielectric layer is measured via the DVM or SMU connected to the probe pad 321. All SMUs and the DVM have a common reference potential. Source 303, drain 304, well and substrate 306 are connected to common reference potential by a SMU or a common ground. Alternatively the pad 321 and at least one of the pads of source, drain or well (323, 324 or 326) can be used as sense lines and therefore can be connected to a DVM to measure the voltage drop.

For capacitances, the probe pads 422, 424 may be connected to power supplying SMUs. The other probe pads 421, 423 can be connected to the common reference potential by SMUs, a common ground, a DVM or one to an SMU and the other to the reference potential (common reference potential by a SMU or common ground). The voltage drop across the dielectric layer is measured via the DVM or SMUs/potentials connected to 421 and 423.

In the dielectric stress test as described for 506, a voltage is applied or a current is injected to the second probe pad 322 or one of the electrodes 422 or 424. At a certain voltage a breakdown of the dielectric film or layer 305, 405 will occur and the structure will be shorted. At this breakdown voltage, a current flow increases substantially. However, as described above, the maximum current flow is limited since there is still a resistance in the current path. The limitation of the current flow limits the creation and dissipation of heat in the breakdown areas and the conducting lines. Hence, possible explosions of the breakdown areas and melting of the conducting lines (see 207 or 217) can be avoided.

Further, the breakdown voltage can be more accurately measured as described above.

During the stress test a continuous check is performed to see if parts of the test structure have fused off without being detected. As shown by box 512, a partial break down of the test structure could be detected. Therefore, a continuous resistance or leakage measurements between 321 and 322 can be used. For capacitance tests, continuous measurements between 421 and 422 and additionally between 423 and 424 can be used. This measurement works for the arrangement shown in FIG. 6*a* (but not 6*b* or 6*c*).

After carrying out the dielectric stress test, at 507, the additional series resistors can be disconnected. This can be performed by switching the test back to the first probe pad 321 or by removing external resistor 325 or 327. At this point, the test setup will be configured as it was for the tests of steps 503 and 504.

Finally, at 508, the electrical measurement and verification of the structure can be performed as described for 501, 502, 503, 504, 509 and 510.

The method of testing a dielectric film and layer has been described with reference to a specific test structure. Other test structures could alternatively be used. For example, while the test structure of FIGS. 3*a-c* includes a specific transistor array, the same testing method could be applied to any other kind of transistor array or single device. FIGS. 4*a-d* describe a specific capacitor array and the measurement method can be applied to any kind of capacity array or single device.

Advantages of preferred embodiments of the present invention include adequate detection of a breakdown voltage. The second probe pad guarantees that the area opposite to the first probe pad is not fused off unnoticed after a breakdown occurs.

Further advantages of preferred embodiments of the present invention include avoiding damage to adjacent circuit elements and probe card damage in case of abrupt breakdown at high voltages. A second conducting line including a resistor limits the current flow flowing through the dielectric layer after a breakdown occurs. A limitation of current flow avoids a possible explosion or melting of the dielectric area or the conducting lines and, therefore, avoids damage of adjacent areas by exposure to heat or scattered particles.

Another advantage of preferred embodiments is a more precise voltage measurement with two pads connected to each electrode of the device.

Yet another advantage of preferred embodiments is the possibility of a complete pre-characterization and excluding structures which are not complete or have bad probe contacts.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention can be also utilized for discrete devices or thin film devices not necessarily processed on semiconductor material.

What is claimed is:

1. A method of making a semiconductor device, the method comprising:
    forming a dielectric layer over a substrate;
    forming a first conductive region adjacent the dielectric layer such that the dielectric layer is between the first conductive region and a second conductive region;
    evaluating the dielectric layer by applying a first test sequence between the first conductive region and the second conductive region, wherein first test sequence is applied through a first resistance, the first test sequence comprising a first set of applied voltages and/or currents; and
    evaluating the dielectric layer by applying a second test sequence between the first conductive region and the second conductive region, wherein the second test sequence is applied through a second resistance that is greater than the first resistance, the second test sequence comprising a second set of applied voltages and/or currents.

2. The method of claim 1, wherein evaluating the dielectric layer by applying the second test sequence comprises performing a destructive test.

3. The method of claim 1, wherein the first test sequence is applied by probing a first probe pad that is electrically coupled to the first conductive region and wherein the second test sequence is applied by probing a second probe pad that is electrically coupled to the first conductive region.

4. The method of claim 3, further comprising checking a conductivity between the first probe pad and the second probe pad prior to evaluating the dielectric, wherein the first conductive region or the second conductive region is electrically connected between the first probe pad and the second probe pad or wherein the first conductive region is electrically connected between two probe pads and the second conductive region is connected between two other probe pads.

5. The method of claim 3, further comprising evaluating the dielectric layer by applying a bias at either the first or the second probe pad and sensing an output at the other of the first or the second probe pad, wherein the first conductive region or the second conductive region or both can have a first and second probe pads each.

6. The method of claim 3, further comprising probing one or more further probe pads that are electrically connected to the first conductive region or the second conductive region while evaluating the dielectric layer.

7. The method of claim 3, wherein the first test sequence is applied by additionally probing a third probe pad that is electrically coupled to the second conductive region and wherein the second test sequence is applied by additionally probing a fourth probe pad that is electrically coupled to the second conductive region.

8. The method of claim 1, wherein the first test sequence is applied by probing a probe pad that is electrically coupled to the first conductive region or second conductive region and wherein the second test sequence is applied by probing the same probe pad.

9. The method of claim 1, wherein evaluating the dielectric layer by applying the first sequence comprises performing a dielectric leakage test or a dielectric characterization measurement.

10. The method of claim 9, wherein evaluating the dielectric layer by applying the second test sequence comprises performing a dielectric stress test.

11. The method of claim 10, wherein the dielectric stress test causes the dielectric layer to breakdown.

12. The method of claim 10, wherein evaluating the dielectric layer by applying the second test sequence further comprises verifying the integrity of the first conductive region and any associated conducting lines and/or the second conductive region and any associated conducting lines before, during and/or after performing the dielectric stress test, wherein the associated conducting lines electrically couple each conductive region to an associated test pad.

13. The method of claim 1, wherein the substrate comprises a semiconductor wafer, the method further comprising, prior to evaluating the dielectric layer, patterning the first conductive region to form a test structure in a test area and to also form a plurality of transistor gates in a die area.

14. The method of claim 13, further comprising, after evaluating the dielectric layer, sawing the wafer to form a plurality of dies, each die comprising a portion of the die area.

15. The method of claim 14, wherein the test structure is located in a kerf area between two adjacent dies.

16. The method of claim 13, wherein the test structure comprises:
- a first test pad;
- a first conducting line coupling the first test pad to the first conductive region, wherein the first conducting line has a first resistance between the first test pad and the first conductive region;
- a second test pad; and
- a second conducting line coupling the second test pad to the first conductive region, wherein the second conducting line has a second resistance between the second test pad and the first conductive region, the first resistance being lower than the second resistance;
- wherein applying the first test sequence comprises probing the first test pad and wherein applying the second test sequence comprises probing the second test pad.

17. A method of making a semiconductor device, the method comprising:
- providing a test structure, the test structure comprising a dielectric located between a first electrode and a second electrode, the first electrode being coupled to a test pad via a resistor; and
- applying a test sequence comprising of a set of voltages and/or currents between the first electrode and the second electrode so that the dielectric breaks down, wherein power due to an increased current between the first electrode and the second electrode is dissipated in the resistor so that neither the first electrode nor the second electrode is substantially physically damaged.

18. The method of claim 17, wherein providing the test structure comprises fabricating the test structure while simultaneously fabricating elements in an integrated circuit adjacent the test structure.

19. The method of claim 18, wherein the integrated circuit is fabricated in a die portion of a wafer and the test structure is fabricated in a kerf region of the wafer, the method further comprising separating the wafer in a plurality of dies by cutting the wafer along the kerf region.

20. The method of claim 17, wherein the test structure comprises a transistor and the dielectric comprises a gate dielectric.

21. The method of claim 17, wherein the test structure comprises a capacitor and the dielectric comprises a capacitor dielectric.

* * * * *